United States Patent [19]

Arakawa

[11] Patent Number: 4,699,690

[45] Date of Patent: Oct. 13, 1987

[54] METHOD OF PRODUCING SEMICONDUCTOR MEMORY DEVICE

[75] Inventor: Hideki Arakawa, Yokohama, Japan

[73] Assignee: Fujitsu Limited, Kawasaki, Japan

[21] Appl. No.: 831,499

[22] Filed: Feb. 21, 1986

[30] Foreign Application Priority Data

Mar. 1, 1985 [JP] Japan .................. 60-041653

[51] Int. Cl.$^4$ .............................................. B44C 1/22
[52] U.S. Cl. .................. 156/662; 148/DIG. 106; 148/DIG. 114; 156/657; 437/52; 437/241
[58] Field of Search .................. 156/657, 643, 662; 29/571, 576 B, 578; 148/171, DIG. 106, DIG. 114, 187

[56] References Cited

U.S. PATENT DOCUMENTS 4,080,718  3/1978  Richman .................. 29/576 B X
4,224,733  9/1980  Spadea .................... 29/576 B X
4,376,658  3/1983  Sigusch ................... 148/1.5
4,507,853  4/1985  McDavid .................. 29/591
4,548,834  10/1985 Tsunge et al. ............. 156/643 X
4,597,827  7/1986  Nishitani ................. 156/643

FOREIGN PATENT DOCUMENTS 55151334  5/1979  Japan ..................... 29/576 B

Primary Examiner—Robert L. Lindsay
Attorney, Agent, or Firm—Staas & Halsey

[57] ABSTRACT

A method of producing a semiconductor memory device comprises the steps of forming a first mask on a substrate and forming an opening in the first mask, implanting impurity ions into the substrate from the opening in the first mask so as to form an impurity region, forming a side wall layer of oxidation-resistant material having a predetermined width on a side surface of the opening in the first mask, forming a tunnel region having a width determined by the predetermined width by using the oxidation-resistant side wall layer as a second mask and forming a gate part on the tunnel region.

17 Claims, 33 Drawing Figures

METHOD OF PRODUCING SEMICONDUCTOR MEMORY DEVICE

BACKGROUND OF THE INVENTION

The present invention generally relates to methods of producing semiconductor memory devices, and more particularly to a method of producing an electrically erasable non-volatile memory.

In large scale semiconductor integrated circuit devices such as large scale integrated circuits (LSIs) and very large scale integrated circuits (VLSIs), electrically erasable non-volatile memories (EEPROMs) are provided as fixed memories in order to expand the functions thereof.

As will be described later on in the specification, an EEPROM cell unit comprises a transistor for selection and a memory transistor for storage, and write, erase and read operations are performed based on voltages which are applied to a bit line, a word line, a control gate, and a source of the EEPROM. Such an EEPROM occupies a large area in the LSI or VLSI, and it is necessary to reduce the area of the memory cells of the EEPROM in order to improve the integration density of the LSI and the VLSI.

A conventional method of producing the EEPROM will be described later in conjunction with the drawings. However, to explain the conventional method briefly, a gate oxide layer and a first resist layer are formed on a P-type silicon substrate. An opening is formed in the first resist layer, and impurity ions are implanted into the substrate through the gate oxide layer from the opening in the first resist layer so as to form an n-type impurity write/erase region in the substrate. Next, the first resist layer is removed, and a second resist layer is formed on the gate oxide layer. The second resist layer has an etching opening which has a shape corresponding to a tunnel region and is above the n-type impurity region. A reactive ion etching process is performed form, the etching opening so as to form in the gate oxide layer, an opening corresponding to the tunnel region.

Thereafter, the second resist layer is removed, and a thermal oxidation process is performed to form a tunnel oxide layer on a surface of the n-type impurity region which is exposed within the opening in the gate oxide layer. A first polysilicon layer is formed on the substrate, and a patterning process is performed. In addition, a silica dielectric layer is formed on the surface of the first polysilicon layer by a thermal oxidation process, and a second polysilicon layer is formed on the dielectric layer. The second polysilicon layer, the dielectric layer and the first polysilicon layer are simultaneously subjected to a patterning process so as to form a floating gate comprising the first polysilicon layer and a control gate comprising the second polysilicon layer. Next, n-type impurity ions are implanted into the substrate with a high concentration by using the control gate as a mask so as to form an n+-type source region and an n+-type drain region.

According to the conventional method described heretofore, the region where the tunnel oxide layer is formed, that is, the tunnel region, is formed on the top surface of the n-type impurity region by a mask alignment. However, when positioning the mask which is used to form the tunnel region with respect to the mask which is used to form the n-type impurity region, a positioning error is inevitably introduced. Accordingly, in order to ensure the formation of the tunnel region on the n-type impurity region regardless of whether the positioning error exists or not, the size of the n-type impurity region must be determined by taking into account a marginal space between two side edges of the n-type impurity region and two side edges of the tunnel region in accordance with the positioning error. On the other hand, the size of the tunnel region is determined by the size of the opening in the gate oxide layer. But, there is a limit in downsizing the opening in the gate oxide layer, and the opening in the gate oxide layer cannot be made extremely small. Hence, there is a limit in reducing the width of the tunnel region which is formed, and it is difficult to form the tunnel region with a width which is under one to two microns.

For these reasons, there is a problem in the conventional method in that it is difficult to further improve the integration density of the EEPROM by further downsizing the memory transistor.

SUMMARY OF THE INVENTION

Accordingly, it is a general object of the present invention to provide a novel and useful method of producing a semiconductor memory device in which the problems described heretofore are eliminated.

Another and more specific object of the present invention is to provide a method of producing a semiconductor memory device in which a side wall layer having a predetermined thickness is formed on a side surface of an opening in a mask which is used when implanting impurity ions into a substrate to form an impurity write/erase region. The side wall layer is used as a mask to define a tunnel region so as to self-align the tunnel region to the write/erase impurity region and the tunnel region is formed with a width determined by the predetermined thickness of the side wall layer. The side wall layer may be formed by the well known side wall technique including a depositing material for the layer over a side wall and then antistropically etching of the layer. According to the method of producing the semiconductor memory device of the present invention, it is unnecessary to take into account a marginal space between one side edge of the impurity write/erase region and one side edge of the tunnel region in accordance with the positioning error because the tunnel region is self-aligned to the impurity write/erase region. Hence, it is possible to reduce the area of the impurity write/erase region and thereby considerably downsize the memory transistor, and as a result, it is possible to further improve the integration density of the EEPROM compared to the conventional method.

Still another object of the present invention is to provide a method of producing a semiconductor memory device in which an oxidation-resistant material for forming the side wall layer is deposited over the mask and an anisotropic etching process is performed in a direction perpendicular to the substrate surface so that an etching residue of the oxidation-resistant layer, having a predetermined thickness, remains on the side surface of the opening in the mask to form the side wall layer. According to the method of producing the semiconductor memory device of the present invention, the width of the tunnel region is determined by the thickness of the oxidation-resistant layer remaining on the side surface of the opening in the mask, and is not determined by the opening in the mask as in the case of the conventional method. As a result, the width of the tunnel region can be made extremely small. For this reason, it is possible to reduce the area of the impurity write/erase region and thereby considerably downsize the memory transistor, and as a result, it is possible to further improve the integration density of the EEPROM compared to the conventional method.

Other objects and further features of the present invention will be apparent from the following detailed description when read in conjunction with the accompanying drawings.

DETAILED DESCRIPTION

Figure 1:
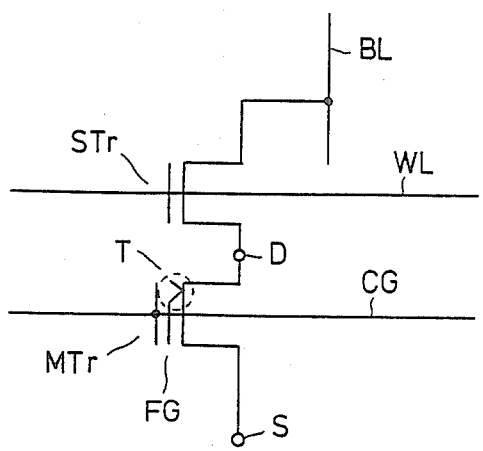
FIG. 1 is a circuit diagram showing a circuit of a general EEPROM.

The construction of the general EEPROM will be described by referring to the circuit shown in FIG. 1. As shown in FIG. 1, the EEPROM comprises a transistor STr for selection and a transistor MTr for storage, and write, erase and read operations are performed according to the following table which shows the operating conditions. In FIG. 1 and the table, D represents a drain, S represents a source, FG represents a floating gate, T represents a dielectric region under the floating gate, BL represents a bit line, WL represents a word line, CG represents a control gate, and Vpp represents a power source voltage in the order of 20 volts (V).

TABLE

|  | BL | WL | CG | S | Flow of electrons |
|---|---|---|---|---|---|
| Write | Vpp | Vpp | 0 | Floating | FG → D |
| Erase | 0 | Vpp | Vpp | 0 | D → FG |
| Read | 1-2 V | 5 V | 0-3 V | 0 | — |

When performing a write operation, the power source voltage Vpp is applied to the bit line BL and the word line WL so as to turn ON the transistor STr. Further, the source S of the transistor MTr is put in a floating state and the voltage at the control gate CG is set to zero. Hence, the potential at the floating gate FG becomes lower than that at the drain D, and the electrons flow from the floating gate FG to the drain D by crossing a tunnel gate. As a result, the potential at the floating gate FG becomes high and the transistor MTr is maintained in the ON state.

On the other hand, when performing an erase operation, the voltage at the bit line BL is set to zero and the voltage Vpp is applied to the word line WL so as to turn ON the transistor STr. In addition, the voltage at the source S of the transistor MTr is set to zero and the voltage Vpp is applied to the control gate CG. Thus, the potential at the floating gate FG becomes higher than that at the drain D, and the electrons flow from the drain D to the floating gate FG by crossing the tunnel gate. Consequently, the potential at the floating gate FG becomes low and the transistor MTr is maintained in the OFF state.

The conventional EEPROM described above is produced by a method which will be described in conjunction with FIGS. 2A through 2E.

Figure 2A:
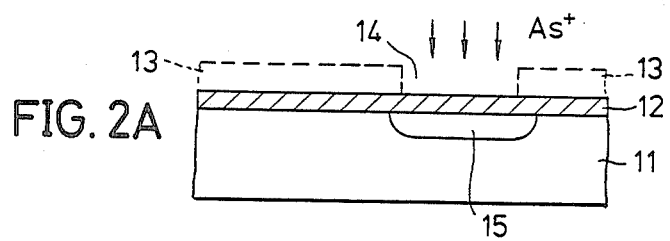
FIGS. 2A through 2E are vertical cross section views showing the processes of the conventional method of producing the element.

First, as shown in FIG. 2A, a gate oxide layer 12 having a thickness in the range of 450 to 1000 Å is formed by an oxidation process on a p-type silicon substrate 11, for example, and a first resist layer 13 is formed on the gate oxide layer 12. An opening 14 through which impurity ions are implanted into the substrate 11, so as to form an n-type impurity write/erase region which constitutes a part of the drain and functions as a write/erase region for writing and erasing information, is formed in the first resist layer 13. The n-type ipurity ions such as arsenic ions ($As^+$) are implanted into the substrate 11 through the gate oxide layer 12 from the opening 14, and a predetermined annealing process is performed after the first resist layer 13 is removed so as to form an n-type impurity write/erase region 15. In each of the views in vertical cross section showing the element in various processes of the convention method and the method of the present invention which will be described later, the thickness of the p-type silicon substrate is shown on a small scale for convenience' sake compared to other layers on the substrate.

Figure 2B:
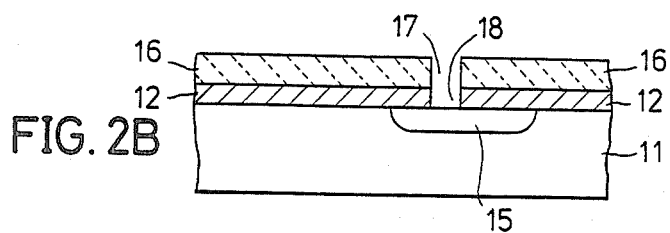

Next, as shown in FIG. 2B, a second resist layer 16 is formed on the gate oxide layer 12, and an etching opening 17 is formed in the second resist layer 16 above the n-type impurity region 15. The shape of the etching opening 17 corresponds to the shape of the n-type impurity region 15 and has a width in the range of one to two microns. A reactive ion etching (RIE) process is performed through the etching opening 17 so as to form an opening 18 in the gate oxide layer 12 in correspondence with a tunnel region.

Figure 2C:
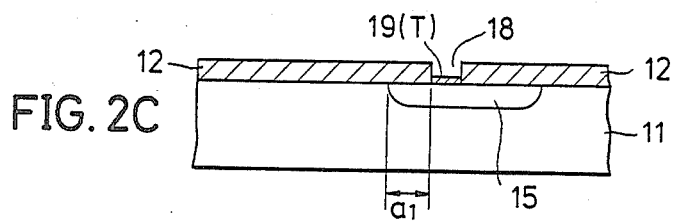

Then, as shown in FIG. 2C, the second resist layer 16 is removed, and a thermal oxidation process is performed to form a tunnel oxide layer 19 on the surface of the n-type impurity region 15 which is exposed within the opening 18 in the gate oxide layer 12. The tunnel oxide layer 19 has a thickness in the range of 80 to 150 Å and becomes a tunnel region T.

Figure 3:
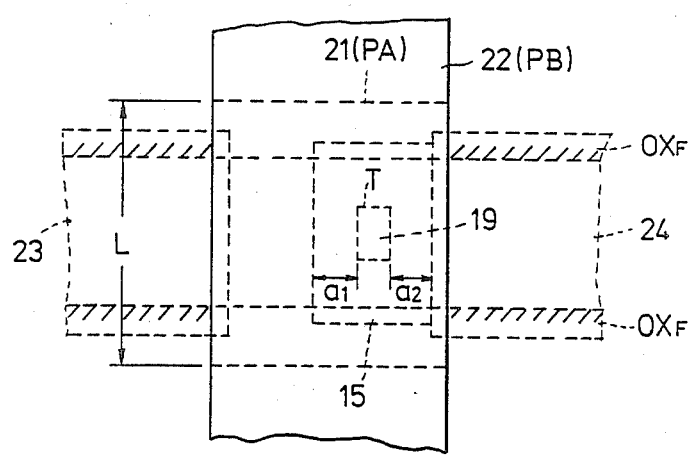
FIG. 3 is a plan view of a memory transistor which is produced by the conventional method shown in FIGS. 2A through 2E.
Figure 2D:
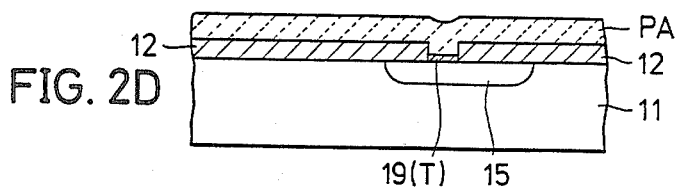

Thereafter, as shown in FIG. 2D, a first polysilicon layer PA is formed on the substrate 11, and a patterning process is performed to determine the length L (see FIG. 3).

Figure 2E:
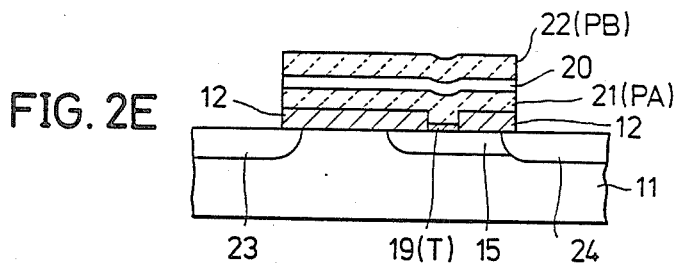

Next, as shown in FIG. 2E, a silica ($SiO_2$) dielectric layer 20 is formed on the surface of the pattern of the first polysilicon layer PA by performing a thermal oxidation process. Then, a second polysilicon layer PB is formed on the substrate 11, and the second polysilicon layer PB, the $SiO_2$ dielectric layer 20 and the first polysilicon layer PA are simultaneously subjected to a patterning process by a lithography means using the RIE process, so as to form a floating gate 21 comprising the first polysilicon layer PA and a control gate 22 comprising the second polysilicon layer PB. Thereafter, n-type impurity ions such as arsenic ions (As+) are implanted into the substrate 11 with a high density by using the control gate 22 as a mask so as to form an n+-type source region 23 and an n+-type drain region 24.

FIG. 3 shows the memory transistor which is produced by the conventional method in the plan view. In FIG. 3, $OX_F$ represents a field oxide layer for isolation, and those parts which are the same as those corresponding parts in FIGS. 2A through 2E are designated by the same reference numerals.

According to the conventional method, the tunnel region T, is formed on the top surface of the n-type impurity region 15 by a mask alignment. However, when positioning the mask which is used to form the tunnel region T with respect to the mask which is used to form the n-type impurity region 15, a positioning error is inevitably introduced. Accordingly, in order to ensure the formation of the tunnel region T on the n-type impurity region 15 regardless of whether the positioning error exits or not, the size of the n-type impurity region 15 must be determined by taking into account a marginal space between two edges of the n-type impurity region 15 and two side edges of the tunnel region T in accordance with th positioning error. In other words, there must be a marginal distance a1 between one side edge of the n-type impurity region 15 and one side edge of the tunnel region T, and a marginal distance a2 between the other side edge of the n-type impurity region 15 and the other side edge of the tunnel region T. For example, the distances a1 and a2 are in the order of 1.5 microns. On the other hand, the size of the tunnel region T is determined by the size of the opening 18 in the gate oxide layer 12. But, there is a limit in downsizing the opening 18 in the gate oxide layer 12, and the opening 18 in the gate oxide layer 12 cannot be made extremely small. Hence, there is a limit in reducing the width of the tunnel region T which is formed, and it is difficult to form the tunnel region T with a width which is under one to two microns.

For these reasons, there is a problem in the conventional method in that it is difficult to further improve the integration density of the EEPROM by further downsizing the memory transistor.

The present invention eliminates the problems of the conventional method described heretofore, and description will now be given with respect to each of the embodiments of the present invention.

FIGS. 4A through 4J are vertical cross section views each showing an element of the processes of the first embodiment of the method of producing the element according to the present invention, and FIGS. 5A through 5G are plan views showing the element in each of the processes of the first embodiment. In FIGS. 5A through 5G, those parts which are the same as those corresponding parts in FIGS. 4A through 4J are designed by the same reference numerals.

Figure 4A:
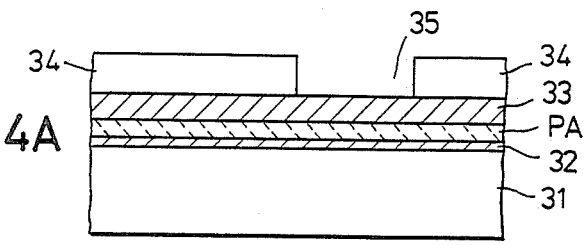
FIGS. 4A through 4J are views in vertical cross section respectively showing an element in each of processes, for explaining the processes of a first embodiment of the method of producing the element according to the present invention.

When producing the memory transistor of the EEPROM according to the method of the present invention, a tunnel dielectric layer, that is, a tunnel $SiO_2$ layer 32 is formed on a p-type silicon substrate 31 as shown in FIG. 4A. The substrate 31 has a resistivity of several tens of Ωm, and the tunnel $SiO_2$ layer 32 has a thickness in the range of 50 to 150 Å so that the electrons can pass through by the tunnel effect. A first polysilicon layer PA which becomes the electrode of the tunnel region and has a thickness in the range of 600 to 1000 Å is formed on the tunnel $SiO_2$ layer 32 by a chemical vapor deposition (CVD) process. A $SiO_2$ mask layer 33 which acts as a layer for blocking the impurity ions is formed on the first polysilicon layer PA. The $SiO_2$ mask layer 33 has a thickness in the range of 1.5 to 2 times the width of the tunnel region which is to be formed, and is in the order of 7000 Å, for example. A first resist layer 34 is formed on the $SiO_2$ mask layer 33, and an etching opening 35 is formed in the first resist layer 34. The etching opening 35 has a shape corresponding to the shape of an n-type impurity write/erase region to be formed. The n-type impurity write/erase region constitutes a part of the drain and functions as a write/erase region for writing and erasing information.

Figure 4B:
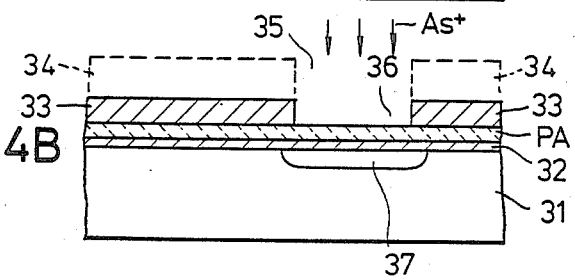

Next, as shown in FIG. 4B, the first resist layer 34 is used as a mask and an opening 36 is formed in the $SiO_2$ mask layer 33 by an RIE process using trifluoromethane, for example. The opening 36 has a shape corresponding to the shape of the n-type impurity region. For example, arsenic ions (As+) are implanted into the substrate 31, at an energy of 150 to 300 keV and to a dosage of $1\times10^{13}$ to $1\times10^{15}$ atoms per cm$^2$ through the first polysilicon layer PA and the tunnel $SiO_2$ layer 32, from the opening 36. Then, the first resist layer 34 is removed, and a predetermined annealing process is performed to activate the implanted arsenic ions (As+) and form an n-type write/erase impurity region 37 which is aligned to the opening 36 and is used for writing and erasing information. As is well known, the n-type impurity region 37 is formed slightly larger than the opening 36, as shown in the cross sectional view of FIG. 4B, due to diffusion.

The activating process may be performed at a later stage. For example, the implanted arsenic ions (As+) may be activated simultaneously with the activation of the source and drain regions. Further, the ion implanting process may be performed immediately after the first resist layer 34 is removed.

Figure 4C:
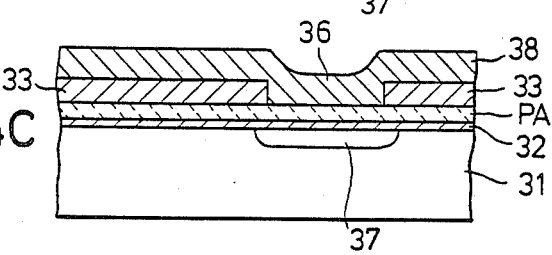

Next, as shown in FIG. 4C, an oxidation-resistant layer 38 made of silicon nitride ($Si_3N_4$), for example, is formed on the $SiO_2$ mask layer 33, including the inside of the opening 36, by a CVD process. The thickness of the $Si_3N_4$ oxidation-resistant layer 38 is in the order of one micron, for example, so as to sufficiently cover the height difference corresponding to the thickness of the $SiO_2$ mask layer 33 at the opening 36.

Figure 4D:
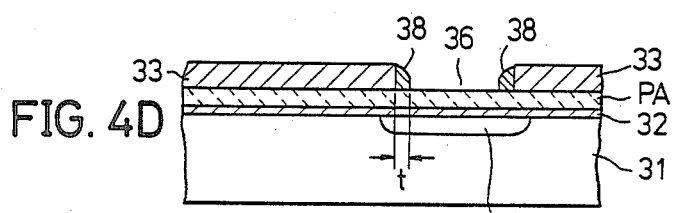
Figure 5A:
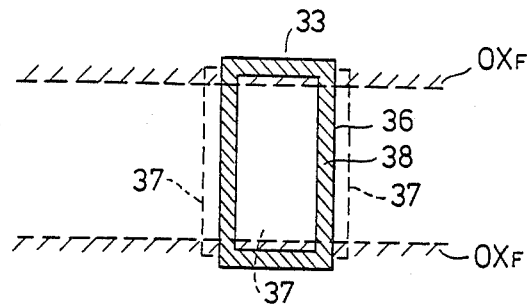
FIGS. 5A through 5G are plan views showing the processes of the first embodiment.

Then, as shown in FIGS. 4D and 5A, the $Si_3N_4$ oxidation-resistant layer 38 is subjected to an anisotropic dry etching process in a direction perpendicular to the substrate surface to etch the entire surface of the $Si_3N_4$ oxidation-resistant layer 38. This etching process causes an etching residue of the $Si_3N_4$ oxidation-resistant layer 38 to remain on the side surface of the opening 36 in the $SiO_2$ mask layer 33, to form a side wall, as is well known in the art. In FIG. 5A, $OX_F$ represents a field oxide layer for isolation.

For example, a RIE process using an etching gas mixture of tetra fluoride ($CF_4$) and oxygen ($O_2$) is used as the etching means. The etching is performed under a condition where the flow ratio $CF_4:O_2$ is 10:1, the etching gas pressure is 0.5 Torr, and the high frequency output is 13.56 MHz, 200 W, for example.

A width (that is, the thickness with respect to the side surface of the opening 36) t of the $Si_3N_4$ side wall layer 38 naturally remaining on the side surface of the opening 36, under the above condition, is in the order of 4000 Å at the bottom, where the width is the maximum. The width t can be controlled and reduced by mixing isotropic gas or performing an over-etching process, and increased by increasing the thickness of the $SiO_2$ mask layer 33.

Figure 4E:
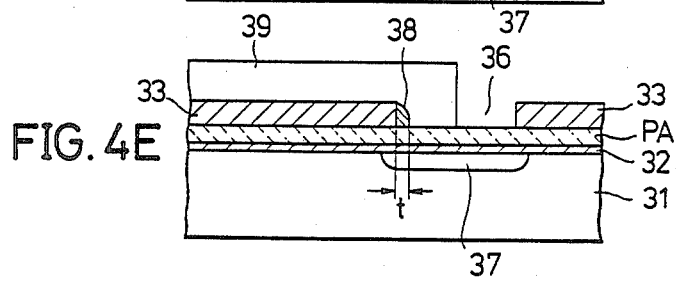
Figure 5B:
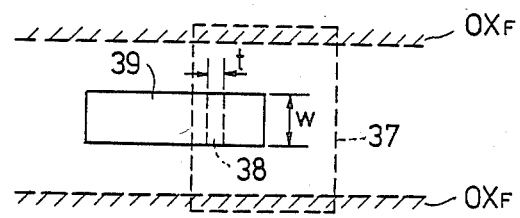

Next, as shown in FIGS. 4E and 5B, a second resist layer pattern 39 having a width of 9000 to 5000 Å, for example, is formed on the $Si_3N_4$ side wall layer 38 to determine the length over which the $Si_3N_4$ side wall layer 38 should remain. Parts of the $Si_3N_4$ side wall layer 38 which are exposed outside the second resist layer pattern 39 are removed by an etching means similar to that described before, so as to form an oxidation-resistant layer pattern 48 which has a width determined by the width t and a minute length determined by a width w of the second resist layer pattern 39 which has a thickness in the range of 9000 to 5000 Å.

Figure 4F:
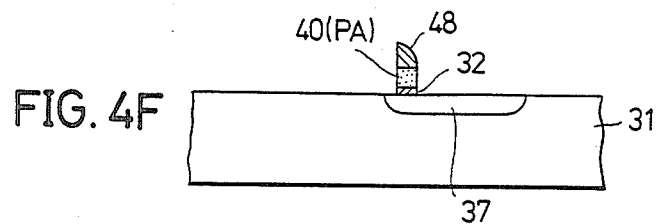
Figure 5C:
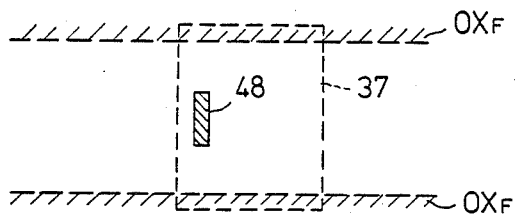

Thereafter, as shown in FIGS. 4F and 5C, after the second resist layer pattern 39 is removed, the $SiO_2$ mask layer 33 is removed by a wet etching means which uses a fluid of the fluoride family, for example. Then, the parts of the first polysilicon layer PA which are exposed outside the oxidation-resistant layer pattern 48 are selectively removed by an RIE process which uses an etching gas mixture of carbon tetrachloride ($CCl_4$) and oxygen ($O_2$), for examle, so as to form a polysilicon pattern 40 which defines the tunnel region.

For example, the RIE process is performed under a condition where the flow ratio $CCl_4:O_2$ is 50:1, the etching gas pressure is 0.5 Torr, and the high frequency output is 13.56 MHz, 300 W, for example.

Next, the exposed tunnel $SiO_2$ layer 32 is selectively removed by a wet etching process. It is not essential to selectively remove the exposed tunnel $SiO_2$ layer 32, however, since the surface of the tunnel $SiO_2$ layer 32 is damaged, it is preferable from the, to improve performance, to form a new tunnel $SiO_2$ layer.

Figure 4G:
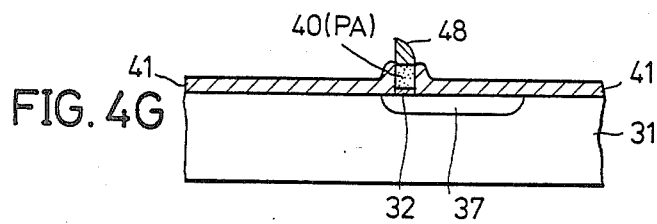
Figure 5D:
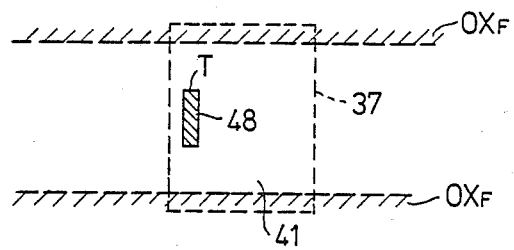

Then, as shown in FIGS. 4G and 5D, a selective oxidation process is performed by using the oxidation-resistant layer pattern 48 as a mask so as to form a gate $SiO_2$ layer 41 on the exposed p-type silicon substrate 31, the surface of the n-type impurity region 37 and the side surface of the polysilicon pattern 40. For example, the thickness of the gate $SiO_2$ layer 41 is in the range of 450 to 1000 Å.

Figure 4H:
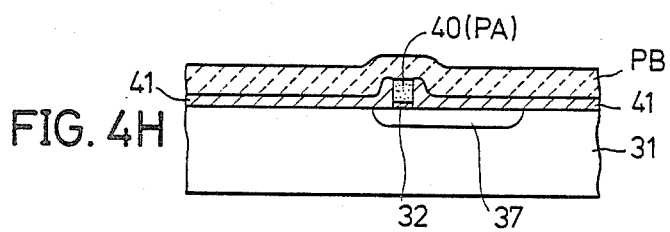
Figure 5E:
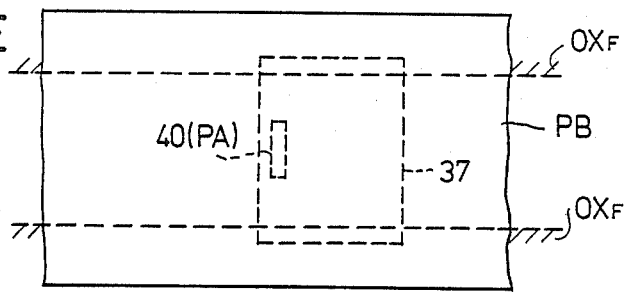

Thereafter, as shown in FIGS. 4H and 5E, the $Si_3N_4$ layer pattern 48 is removed by a process such as the phosphoric acid boiling process, and a second polysilicon layer PB which becomes the floating gate is formed on the substrate 31 so as to make contact with the surface of the polysilicon pattern 40. The second polysilicon layer is formed on the substrate 31 by performing a CVD process. The thickness of the second polysilicon layer PB is in the range of 2000 to 5000 Å. Then, the second polysilicon layer PB is made conductive by performing a process such as the ion implanting process, and a patterning process is performed to determine the length of the floating gate by the usual lithography technology.

Figure 4I:
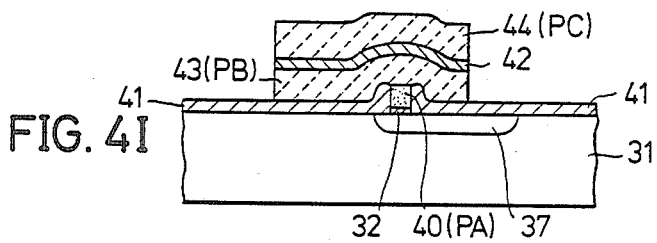
Figure 5F:
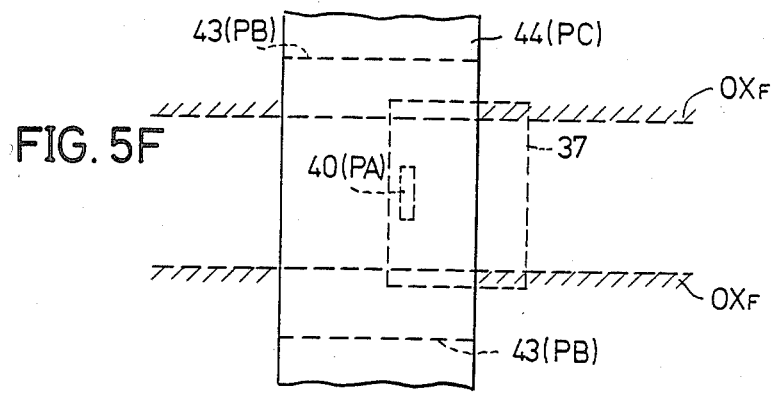

Next, as shown in FIGS. 4I and 5F, a $SiO_2$ dielectric layer 42, having a thickness in the range of 450 to 1000 Å, for example, is formed on the second polysilicon layer PB by a thermal oxidation process or the like. A third polysilicon layer PC, having a thickness in the range of 3000 to 6000 Å is formed on the $SiO_2$ dielectric layer 42 by a CVD process, and the third polysilicon layer PC is made conductive by performing a process such as the ion implanting process. Thereafter, by use of a single mask, the third polysilicon layer PC, the $SiO_2$ dielectric layer 42, and the second polysilicon layer PB are successively patterned by a RIE process similar to that described before. The so-called double-alignment method is employed.

Therefore, a floating gate electrode 43, which comprises the second polysilicon layer PB and connects to the n-type impurity region 37 through the polysilicon pattern 40 and the tunnel $SiO_2$ layer 32, and a control gate electrode 44, which comprises the third polysilicon layer PC and connects to the floating gate electrode 43 through the $SiO_2$ dielectric layer 42, are formed.

Figure 4J:
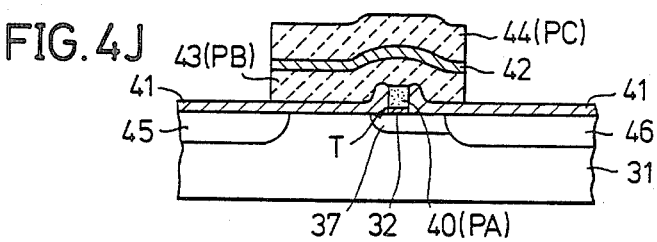
Figure 5G:
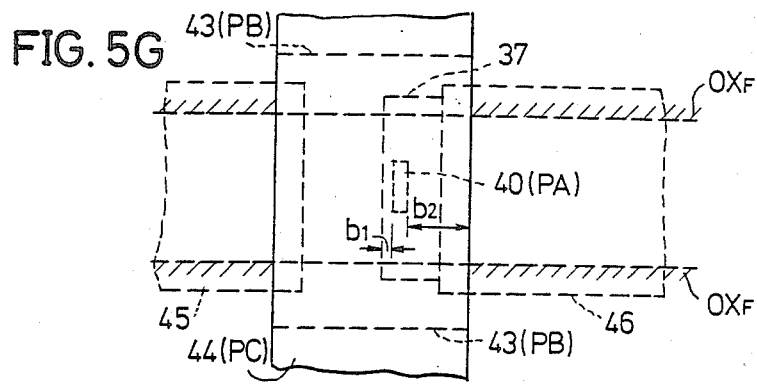

As shown in FIGS. 4J and 5G, the control gate electrode 44 is used as a mask, and arsenic ions are implanted into the p-type silicon substrate 31 through the gate $SiO_2$ layer 41 to a high dosage of $1 \times 10^{15}$ to $5 \times 10^{15}$ atoms per $cm^2$ so as to form an $n^+$-type source region 45 and an $n^+$-type drain region 46. The $n^+$-type drain region 46 is in contact with the n-type impurity region 37.

Although not shown in the drawings, a dielectric layer, wiring layers and the like are formed thereafter, and the EEPROM comprising the memory transistor described heretofore is completed.

As is clear from the description give heretofore, the tunnel region T, comprising the tunnel $SiO_2$ layer 32 and the polysilicon layer pattern 40, is self-aligned with respect to the n-type impurity region 37, which performs the transfer of the electrons between the floating gate electrode 42 through the tunnel region T. In other words, in the present embodiment, the tunnel region T is self-aligned to the side surface of the opening 36 in the mask layer 33, which opening 36 is used when forming the n-type impurity region 37. Accordingly, due to the self-alignment, there is no need to take into account a marginal space between one side edge of the n-type impurity region 37 and one side edge of the tunnel region T in accordance with the positioning error. As is clear by comparing FIGS. 3 and 5G, a distance b1 between one side edge of the n-type impurity region 37 and one side edge of the tunnel region T is extremely small compared to the distance a1 shown in FIG. 3, because there is no need to take into account a marginal distance between the one side edge of the n-type impurity region 37 and the one side edge of the tunnel region T in accordance with the positioning error. A marginal distance b2 between the other side edge of the n-type impurity region 37 and the other side edge of the tunnel region T is substantially the same as the marginal distance a2 shown in FIG. 3, however, the area of the n-type impurity region 37 which finally remains in the present embodiment as shown in FIG. 5G is extremely small compared to that obtained by the conventional method, since the width t of the tunnel region T is extremely small and the distance b1 is extremely small compared to the distance a1.

The width of the tunnel region T is determined by the width t of the side wall layer which is formed on the side surface of the opening 36, and the length of the tunnel region T is determined by the width w of the remaining smallest pattern. Hence, the area of the tunnel region T can be made extremely small. For example, the width t of the tunnel region T is in the range of 0.5 to 1.0 micron.

In the present embodiment, the polysilicon layer PA is formed on the tunnel $SiO_2$ layer 32 and the impurity ions are implanted into the substrate 31 through the tunnel $SiO_2$ layer 32 and the polysilicon layer PA. However, the polysilicon layer PA may be omitted. On the other hand, when the implantation of the impurity ions is performed through the tunnel SiO$_2$ layer from directly above using a resist layer as a mask and the resist layer contains contaminants, the surface of the tunnel SiO$_2$ layer may be contaminated by the resist layer. Further, after the impurity implantation, the chemicals used to remove the resist layer contaminate or etch the tunnel SiO$_2$ layer, thereby deteriorating the properties of the thin tunnel SiO$_2$ layer, decreasing the layer thickness thereof, and thus deteriorating the stability of the characteristics of the resultant device. For this reason, as previously proposed in a United States patent application Ser. No. 654,629 filed Sept. 26, 1984 in which the assignee is the same as the assignee of the present application, it is preferable to form the polysilicon layer on the tunnel SiO$_2$ layer and perform the impurity implantation through the polysilicon layer and the tunnel SiO$_2$ layer.

Figure 6A:
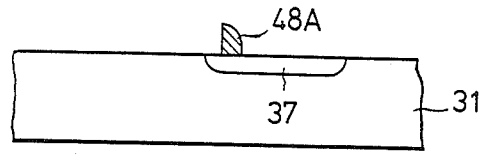
FIGS. 6A through 6F are vertical cross section views showing the essential processes of a modification of the first embodiment.

Next, description will be given with respect to a modification of the first embodiment. In the present modification, the SiO$_2$ mask layer 33 is formed directly on the substrate 31 in a process corresponding to the process shown in FIG. 4A. In other words, the tunnel SiO$_2$ layer 32 and the first polysilicon layer PA of the first embodiment are not formed in the present modification. Other than the fact that the tunnel SiO$_2$ layer 32 and the polysilicon layer PA are not formed, processes similar to the processes shown in FIGS. 4A through 4E are performed. Hence, the illustration and description of such processes corresponding to the processes shown in FIGS. 4A through 4E will be omitted. After the process corresponding to the process shown in FIG. 4E is performed, the second resist layer pattern 39 is removed and the SiO$_2$ mask layer 33 is thereafter removed by a wet etching means as shown in FIG. 6A. Hence, only a side wall layer 48A made of an oxidation-resistant material remains on the substrate 31. In FIGS. 6A through 6E, those parts which are the same as those corresponding parts in FIGS. 4A through 4J are designated by the same reference numerals.

Figure 6B:
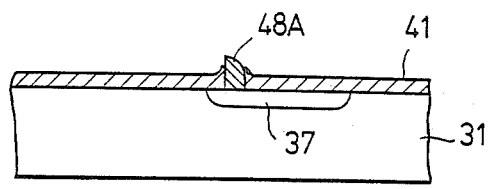

Then, as shown in FIG. 6B, a selective oxidation process is performed by using the oxidation-resistant layer pattern 48A as a mask so as to form the gate SiO$_2$ layer 41 on the exposed p-type silicon substrate 31, the surface of the n-type impurity region 37 and the side surface of the oxidation-resistant layer pattern 48A. For example, the thickness of the gate SiO$_2$ layer 41 is in the range of 450° to 1000 Å.

Figure 6C:
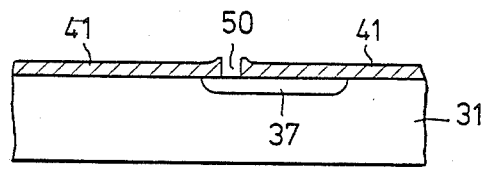

Thereafter, as shown in FIG. 6C, the oxidation-resistant layer pattern 48A is removed by a process such as the phosphoric acid boiling process so that an opening 50 remains on the substrate 31.

Figure 6D:
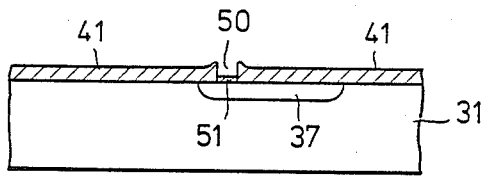

As shown in FIG. 6D, a tunnel dielectric layer having a thickness in the range of 50 to 150 Å so that the electrons can pass through by the tunnel effect, that is, a tunnel SiO$_2$ layer 51, is formed on the substrate 31 within the opening 50.

Figure 6E:
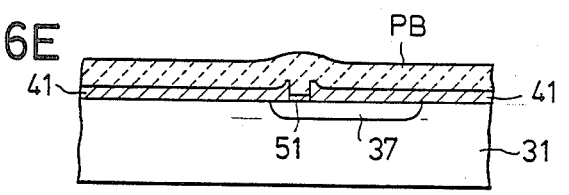

Next, as shown in FIG. 6E, the polysilicon layer PB which becomes the floating gate and has a thickness in the range of 2000 to 5000 Å is formed on the substrate 31 by the CVD process so as to make contact with the surface of the tunnel SiO$_2$ layer 51. The polysilicon layer PB is made conductive by performing a process such as the ion implanting process, and a patterning process is performed by use of the usual lithography technology so as to determine the length of the floating gate.

Figure 6F:
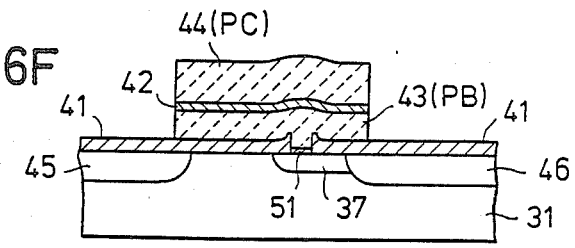

Thereafter, processes similar to the processes described before in conjunction with FIGS. 4I and 4J are performed, and the memory transistor shown in FIG. 6F is completed.

Figure 7A:
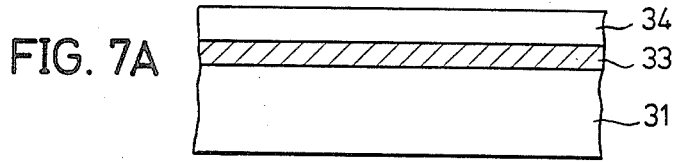
FIGS. 7A through 7C are vertical cross section views showing the essential processes of a second embodiment of the methiod of producing the element according to the present invention.
Figure 7B:
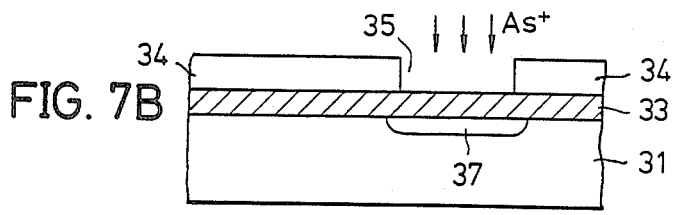
Figure 7C:
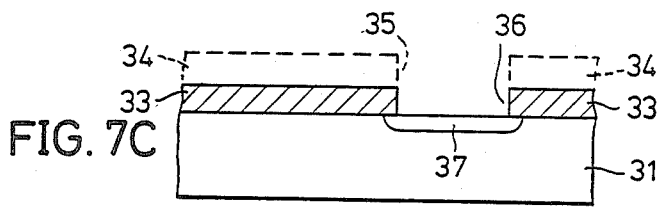

Next, description will be given with respect to a second embodiment of the method according to the present invention by referring to FIGS. 7A through 7C. In FIGS. 7A through 7C, those parts which are the same as those corresponding parts in FIGS. 4A and 4B are designated by the same reference numerals. In the present embodiment, the SiO$_2$ mask layer 33 is formed directly on the substrate 31 as in the case of the modification of the first embodiment described before. Hence, as shown in FIG. 7A, the tunnel SiO$_2$ layer 32 and the first polysilicon layer PA of the first embodiment are not formed. The resist layer 34 is formed on the SiO$_2$ mask layer 33, and as shown in FIG. 7B, impurity ions are implanted into the p-type silicon substrate 31 through the SiO$_2$ mask layer 33 from the opening 35 in the resist layer 34 so as to form the n-type impurity region 37 which is aligned to the opening 35. Then, as shown in FIG. 7C, the hole 36 corresponding to the hole 35 of the resist layer 34 is formed in the SiO$_2$ mask layer 33, and the resist layer 34 is removed. As shown in FIG. 7C, the opening 36 is formed slightly smaller than the n-type impurity region 37. Besides the fact that the tunnel SiO$_2$ layer 32 and the first polysilicon layer PA are not formed, processes which are similar to the processes shown in FIGS. 4C through 4E are performed thereafter. Then, the processes described in conjunction with FIGS. 6A through 6F are performed.

As a modification of the second embodiment, it is possible to form the tunnel SiO$_2$ layer 32 and the first polysilicon layer PA between the substrate 31 and the SiO$_2$ mask layer 33 as in the case shown in FIG. 4A. In this case, the impurity ions are implanted into the substrate 31 through the SiO$_2$ mask layer 33, the first polysilicon layer PA and the tunnel SiO$_2$ layer 32, from the opening 35 in the resist layer 84, so as to form the n-type impurity region 37.

In the embodiments and the modifications described heretofore, the tunnel region of the memory transistor for performing the information write/erase operation in the EEPROM is self-aligned and can be formed without taking into account a marginal space with respect to the drain region. Further, it is possible to make the area of the tunnel region extremely small. As a result, the memory transistor can be downsized considerably, and it becomes possible to increase the integration density of the EEPROM and hence increase the integration density of the LSI or VLSI which comprises the EEPROM.

The mask which is used to form the n-type impurity region in the substrate in the present invention is not limited to SiO$_2$, used for the purpose of example in the embodiments. The mask may be made of any suitable material by taking into account the polysilicon layer and the oxidation-resistant layer and the etching process which are employed.

In addition, the material used for the floating gate electrode and the control gate electrode is not limited to polysilicon.

Moreover, the SiO$_2$ layer which is formed by the thermal oxidation process is used as the tunnel dielectric layer in the embodiments, however, the tunnel dielectric layer is not limited to SiO$_2$.

Further, the present invention is not limited to these embodiments, but various variations and modifications may be made without departing from the scope of the present invention.

What is claimed is:

1. A method of producing a semiconductor memory device, comprising:
    forming a first mask on a substrate and forming an opening in said first mask;
    implanting impurity ions into said substrate through the opening in said first mask to form an impurity region;
    forming a side wall layer having a predetermined width on a side surface of the opening in said first mask;
    forming a tunnel region having a width determined by said predetermined width on said impurity region by using said side wall layer as a second mask; and
    forming a gate dielectric layer surrounding said tunnel region and subsequently forming thereon a gate electrode covering said tunnel region and extending over said gate dielectric layer.

2. A method as claimed in claim 1, further comprising forming a first dielectric layer on said substrate, where said first mask is formed on said first dielectric layer.

3. A method as claimed in claim 2, further comprising forming a first conductor layer on said first dielectric layer, where said first mask is formed on said first conductor layer.

4. A method as claimed in claim 1, wherein said first mask is formed directly on said substrate and the opening is formed in said first mask.

5. A method as claimed in claim 1, wherein said side wall layer has a width of approximately 4000 Å.

6. A method as claimed in claim 1, further comprising forming a first dielectric layer on said substrate on which said first mask is formed, wherein said impurity ions are implanted into said substrate through said first dielectric layer from the opening in said first mask.

7. A method of producing a semiconductor memory device comprising the steps of:
    forming on a semiconductor substrate a tunnel dielectric layer having such a thickness that electrons can pass through the tunnel dielectric layer;
    forming a polysilicon layer on said tunnel dielectric layer;
    forming on said polysilicon layer a mask layer for blocking impurity ions;
    forming an opening in said mask layer;
    implanting impurity ions into said silicon substrate through said polysilicon layer and said tunnel dielectric layer from the opening in said mask layer so as to form an impurity region which is aligned to the opening in said mask layer;
    forming an oxidation-resistant layer on said mask layer including an inside of the opening in said mask layer;
    subjecting said oxidation-resistant layer to an etching process in a direction perpendicular to the substrate surface to etch and remove said oxidation-resistant layer so that an etching residue of said oxidation-resistant layer remains on a side surface of the opening in said mask layer with a predetermined width;
    patterning the remaining oxidation-resistant layer into a predetermined length so as to obtain an oxidation-resistant layer pattern;
    removing said mask layer;
    patterning said polysilicon layer by using said oxidation-resistant layer pattern as a mask so as to obtain a polysilicon layer pattern;
    forming a gate oxide layer having a thickness greater than the thickness of said tunnel dielectric layer on an exposed surface of said silicon substrate and a side surface of said polysilicon layer pattern by performing a selective oxidation process by using said oxidation-resistant layer pattern as a mask;
    removing said oxidation-resistant layer pattern; and
    forming a gate electrode which makes contact with a surface of said polysilicon layer pattern on said gate oxide layer including the surface of said polysilicon layer pattern.

8. A method of producing a semiconductor memory device, comprising:
    forming a first spacer layer on a substrate;
    forming a first mask on said first spacer layer and forming an opening in said first mask;
    implanting impurity ions into said substrate through said first spacer layer from the opening in said first mask to form an impurity region;
    forming in said first spacer layer an opening corresponding to the opening in said first mask;
    removing said first mask;
    forming a side wall layer having a predetermined width on a side surface of the opening in said first spacer layer;
    forming a tunnel region having a width determined by said predetermined width on said impurity region by using said side wall layer as a second mask; and
    forming a gate part on said tunnel region.

9. A method of producing a semiconductor memory device, comprising:
    forming a first mask on a substrate and forming an opening in said first mask;
    implanting impurity ions into said substrate through the opening in said first mask to form an impurity region;
    forming a side wall layer having a predetermined width on a side surface of the opening in said first mask, forming an oxidation-resistant layer on said first mask which has the opening, and subjecting said oxidation-resistant layer to an etching process in a direction perpendicular to the substrate surface to etch and remove said oxidation-resistant layer leaving an etching residue of said oxidation-resistant layer on the side surface of the opening in said first mask with said predetermined width to form said side wall layer;
    forming a tunnel region having a width determined by said predetermined width by using said side wall layer as a second mask; and
    forming a gate on said tunnel region.

10. A method of producing a semiconductor memory device, comprising:
    forming a first mask directly on a substrate and forming an opening in said first mask;
    implanting impurity ions into said substrate through the opening in said first mask to form an impurity region;
    forming a side wall layer having a predetermined width on a side surface of the opening in said first mask, forming an oxidation-resistant layer on said first mask which has the opening, and subjecting said oxidation-resistant layer to an etching process in a direction perpendicular to the substrate surface to etch and remove said oxidation-resistant layer leaving an etching residue of said oxidation-resistant layer on the side surface of the opening in said first mask with said predetermined width to form said side wall layer.

11. A method of producing a semiconductor memory device, comprising:
   forming a first spacer layer on a substrate;
   forming a first mask on said first spacer layer and forming an opening in said first mask;
   implanting impurity ions into said substrate through said first spacer layer from the opening in said first mask to form an impurity region;
   forming in said first spacer layer an opening corresponding to the opening in said first mask;
   removing said first mask;
   forming a side wall layer having a predetermined width on a side surface of the opening in said first spacer layer, forming an oxidation-resistant layer on said first spacer layer which has the opening, and subjecting said oxidation-resistant layer to an etching process in a direction perpendicular to the substrate surface to etch and remove said oxidation-resistant layer leaving an etching residue of said oxidation-resistant layer on the side surface of the opening in said first spacer layer with said predetermined width to form said side wall layer;
   forming a tunnel region having a width determined by said predetermined width by using said side wall layer as a second mask, forming a gate dielectric layer on said substrate by using the remaining oxidation-resistant layer as said second mask, removing said second mask, and forming a first dielectric layer on a part of said substrate which is exposed by the removal of said second mask; and
   forming a gate on said tunnel region, by forming a first conductor layer on said gate dielectric layer, forming a second dielectric layer on said first conductor layer, and forming a second conductor layer on said second dielectric layer.

12. A method as claimed in claim 9, further comprising forming a first dielectric layer on said substrate, where said first mask is formed on said first dielectric layer.

13. A method as claimed in claim 12, further comprising forming a first conductor layer on said first dielectric layer, where said first mask is formed on said first conductor layer.

14. A method as claimed in claim 12, further comprising:
   selectively forming the gate dielectric layer on said substrate by using the remaining oxidation-resistant layer as said second mask; and
   removing said second mask.

15. A method as claimed in claim 14, wherein said gate forming step comprises:
   forming a second conductor layer on said gate layer;
   forming a second dielectric layer on said second conductor layer; and
   forming a third conductor layer on said second dielectric layer.

16. A method as claimed in claim 10, further comprising:
   forming the gate dielectric layer on said substrate by using the remaining oxidation-resistant layer as said second mask; and
   removing said second mask.

17. A method as claimed in claim 16, wherein said gate forming step comprises:
   forming a second conductor layer on said gate layer;
   forming a second dielectric layer on said second conductor layer; and
   forming a third conductor layer on said second dielectric layer.

* * * * *